(12) United States Patent
Frisa et al.

(10) Patent No.: US 6,472,237 B1
(45) Date of Patent: Oct. 29, 2002

(54) METHOD AND SYSTEM FOR DETERMINING A THICKNESS OF A LAYER

(75) Inventors: Larry Frisa, Round Rock, TX (US); Karl Mautz, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/033,066

(22) Filed: Oct. 26, 2001

(51) Int. Cl.[7] ........................... G01R 31/26; H01L 21/66
(52) U.S. Cl. ........................................ 438/14; 356/448
(58) Field of Search .............................. 438/14, 15–18, 438/5, 7, 800; 356/445, 448, 152.2

(56) References Cited

U.S. PATENT DOCUMENTS 6,108,087 A * 8/2000 Nikoonahad et al. ....... 356/503

* cited by examiner

*Primary Examiner*—Craig Thompson

(57) ABSTRACT

The present invention relates to a method of determining a thickness of at least one layer on at least one semiconductor wafer (12), comprising the steps of: projecting a first laser pulse (14) on a surface (16) of the at least one layer (10), thereby generating an acoustical wave due to heating of the surface of the at least one layer (10); after a propagation time of the acoustical wave, projecting a series of second laser pulses (18) on the surface (16) of the at least one layer (10); measuring reflected laser pulses (20) of the second laser pulses (18), thereby sensing the times of reflection property changes of the surface (16) of the at least one layer (10); and determining the thickness of the at least one layer (10) by analyzing the times of reflection property changes. The present invention further relates to a system for determining a thickness of a layer (10) on a semiconductor wafer (12).

13 Claims, 6 Drawing Sheets

METHOD AND SYSTEM FOR DETERMINING A THICKNESS OF A LAYER

FIELD OF THE INVENTION

The present invention generally relates to a method of determining a thickness of a layer on a semiconductor wafer, and more particularly to a method of determining the thickness of opaque layers. The present invention further relates to a system for determining a thickness of a layer on a semiconductor wafer.

BACKGROUND OF THE INVENTION

There are several semiconductor wafer processing techniques in which thin layers or films are deposited and/or removed. These techniques could be improved by the knowledge of the layer thickness. Frequently, optical techniques are used to determine the layer thickness. However, these techniques only work for measuring transparent layers.

For example, electroplating is an emerging process technology being used to facilitate the deposition of copper films to integrated circuit structures. The technology of electroplating is currently limited by the lack of process control mechanisms including deposition termination. The process is typically performed with timed process steps which does not guarantee a deposition with accurate thickness.

As another example, plasma etch tool technology is currently limited by endpointing schemes that are not directly based on film thickness targets but on indirect methods. Such indirect methods are, for example, optical emission spectroscopy, or timing methods that are based on previously run test wafers. Further, as the film thickness is decreasing, interferometry may be used as an indirect endpoint determination.

Also wet tool technology is currently limited by endpointing schemes that are not directly based on film thickness targets. Also in this case, timed methods based on previously run test wafers are used.

Similarly, in diffusion process technology, indirect methods are used. Also in this case, interferometry, or timed methods based on previously run test wafers are employed.

Further technologies in which the thickness of layers on a wafer is of interest are chemical vapor deposition (CVD) and physical vapor deposition (PVD). Also in these processes, the current measurement technology is limited by a lack of control mechanisms.

The present invention seeks to solve the above mentioned problems by providing a new method and a new system for reliably and accurately determining a thickness of a layer on a semiconductor wafer.

DETAILED DESCRIPTION OF PREFERRED EMBODIMENTS

Figure 1:
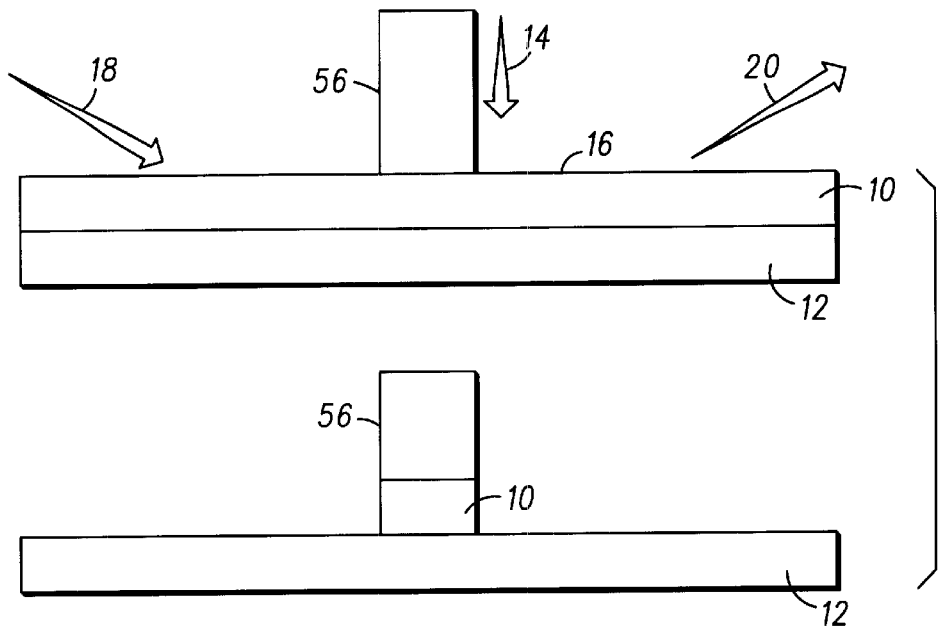
FIG. 1 shows two schematic cross sectional views of semiconductor wafers with different layers, illustrating the present invention.

According to the present invention, a method of determining a thickness of at least one layer 10 on at least one semiconductor wafer 12 is provided, comprising the steps of:

projecting a first laser pulse 14 on a surface 16 of the at least one layer 10, thereby generating an acoustical wave due to heating of the surface 16 of the at least one layer 10, after a propagation time of the acoustical wave, projecting a series of second laser pulses 18 on the surface 16 of the at least one layer 10, measuring reflected laser pulses 20 of the second laser pulses 18, thereby sensing the times of reflection property changes of the surface 16 of the at least one layer 10, and determining the thickness of the at least one layer 10 by analyzing the times of reflection property changes.

According to the present invention, there is further provided a system for determining a thickness of at least one layer 10 on at least one semiconductor wafer 12, comprising means 22, 28, 30 for projecting a first laser pulse 14 on a surface 16 of the at least one layer 10, thereby generating an acoustical wave due to heating of the surface 16 of the at least one layer 10, means 24, 28 for projecting a series of second laser pulses 18 on the surface 16 of the at least one layer 10, means 30 for measuring reflected laser pulses 20 of the second laser pulses 18, thereby sensing the times of reflection property changes of the surface 16 of the at least one layer 10, and means for determining the thickness of the at least one layer 10 by analyzing the times of reflection property changes.

Acoustical wave techniques use a first laser pulse to produce a fine spot of instantaneous heating on the wafer surface. This produces a localized sound wave that propagates through the film layer. When an interface is reached, a partial echo signal is returned. A portion of the sonic wave crosses the interface and it propagates through the underlying film layer. This process continues through all layers. Each echo wave returning to the surface changes the surface reflection property. This reflection property change is measured by the second laser pulses. These probe pulses may be diverted from the first laser pulse by a beam splitter. After detection of the second laser pulses, a software analysis of the signal converts the time between sound generation and echo wave detection into an accurate film thickness value. Multilayer film stacks can be measured individually or simultaneously. An important advantage of this technique is related to the possibility to measure opaque film layers deposited on a wafer that cannot be measured optically. Additionally, the laser beam can be moved to multiple locations across the wafer to measure within-wafer uniformity.

The described technique may be used to measure the thickness of films deposited by electroplating. It is possible to measure the film thickness in solutions comprising plating materials, such as copper. Such electroplating is performed, for example, by depositing each wafer individually by immersing in a solution and applying electric current. The measurement technique can be implemented when the wafer is removed from the solution. Based on the measurement results, additional depositions can be performed. The system according to the present invention can be used as an end-pointing system, if it is employed directly in the deposition solution. In this case, the measurement technique could be referenced using a separate tank with similar solutions without wafers to subtract out the contribution of the liquid to the measurement result. Such a reference tank may also be used for determining the properties of the solution. This could be achieved by employing a reference tank which is not used for processing.

Figure 2:
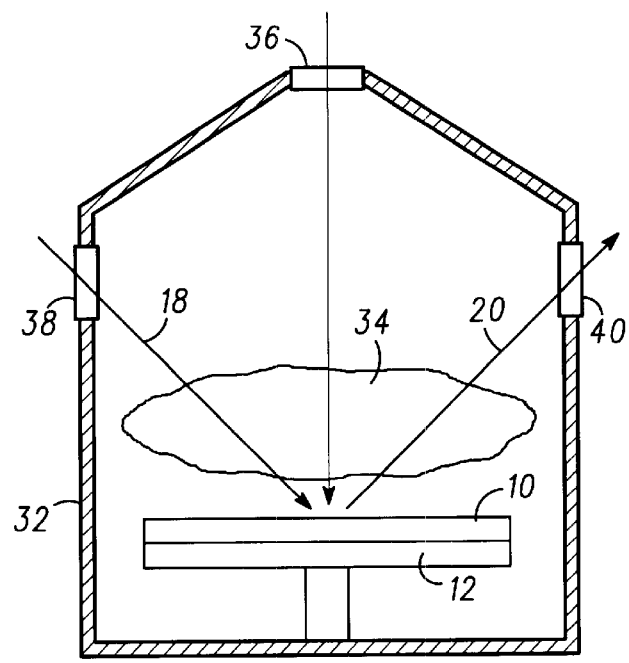
FIG. 2 is a cross sectional view of a plasma etch chamber, illustrating a system according to the present invention.

FIG. 1 shows two schematic cross sectional views of semiconductor wafers with different layers, illustrating the present invention. FIG. 2 is a cross sectional view of a plasma etch chamber, illustrating a system according to the present invention.

In the upper part of FIG. 1 a semiconductor wafer 12 is shown at a first time during plasma etch. In the lower part of FIG. 1 the semiconductor 12 is shown at a second time, after the first time. The semiconductor 12 has a layer 10 that is to be removed by plasma etching. A further structure 56 is provided on the layer 10. Below this structure 56 the layer 10 is maintained. On the surface 16 of the layer 10 a first laser pulse 14 is projected. Thereby, an acoustical wafer is generated due to heating of the surface 16. A second laser pulse 18 is projected on the surface 16, and it is reflected. The reflected laser pulse 20 may be detected. Since the reflection property changes of the surface 16 depend on the thickness of the layer 10, the thickness of the layer 10 may be determined by measuring the reflection property changes.

In FIG. 2 an plasma etch process chamber 32 with a window 36 for the first laser pulse, a window 38 for the incoming second laser pulse and a window 40 for the reflected second laser pulse 20 is provided. Within the plasma etch process chamber the plasma 34 is established. Due to the set-up, an in-situ measurement of the thickness of layer 10 is possible.

The described measurement method for plasma etch chambers is designed to work on areas with and without topography. The method eliminates the need for test wafers and errors associated with targeting deposition times on unpatterned wafers versus wafers with topography and features. Another achievable measurement feature is the profiling of side wall deposition in the chamber. Also, processes that remove a certain portion of a film layer while stopping in the same layer, such as recess etches, could benefit from the method and system according to the present invention.

The acoustical wave metrology allows measurement of different opaque films, such as metals, individual oxides or dielectric films, and on film-stacks consisting of oxides and metals. The sample area could be chosen precisely using a pattern recognition system or scan area. Photoresist selectivity could also be monitored in real time during the plasma etch processing. Processes could be modified to respond to the results of measurements, such as triggering overetch steps for endpointing, or reduction in parameters to slow etching to achieve precise removal targets.

Figure 3:
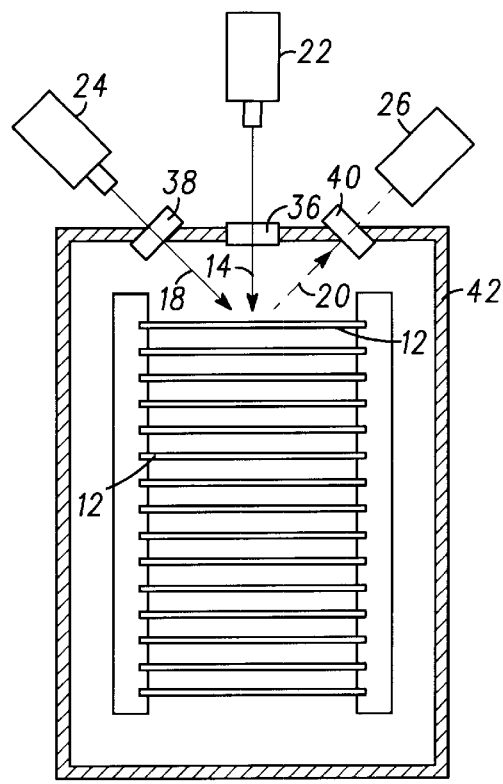
FIG. 3 is a top view of a wet processing tank, illustrating a system according to the present invention.

FIG. 3 is a top view of a wet processing tank 42, illustrating a system according to the present invention. In a wet processing tank 42 a plurality of wafers 12 is arranged. Only one of these wafers 12 is monitored by the system and method according to the present invention. Through a window 36 a first laser pulse 14 is projected on the first wafer 12. Through another window 38 a series of second laser pulses 18 is projected. Both laser pulses may be projected from different lasers 22, 24. Alternatively, the laser pulses 14, 18 may be generated from the same laser and diverted by a beam splitter. The reflected second laser pulse 20 propagates through a third window 40 or view port, and it is detected by a detector 26.

Figure 4:
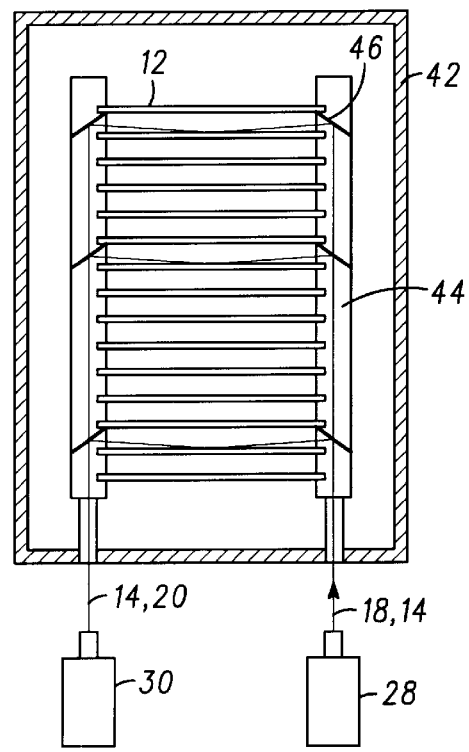
FIG. 4 is a top view of a wet processing tank, illustrating a further system according to the present invention.

FIG. 4 is a top view on a wet processing tank 42, illustrating a further system according to the present invention. In this set-up also a plurality of wafers 12 is arranged in a wet processing tank 42. However, more than one wafer 12 can be monitored. To achieve this, a quartz boat 44 and mirrors 46 are used to transmit the laser beams 14, 18, 20. The functional block 30 may operate as a laser, so that the first laser pulse may be projected from both sides on the wafers 12. During transmission of the second laser pulses 18, the functional block 30 operates as a detector for measuring the reflected second laser pulses 20.

Figure 5:
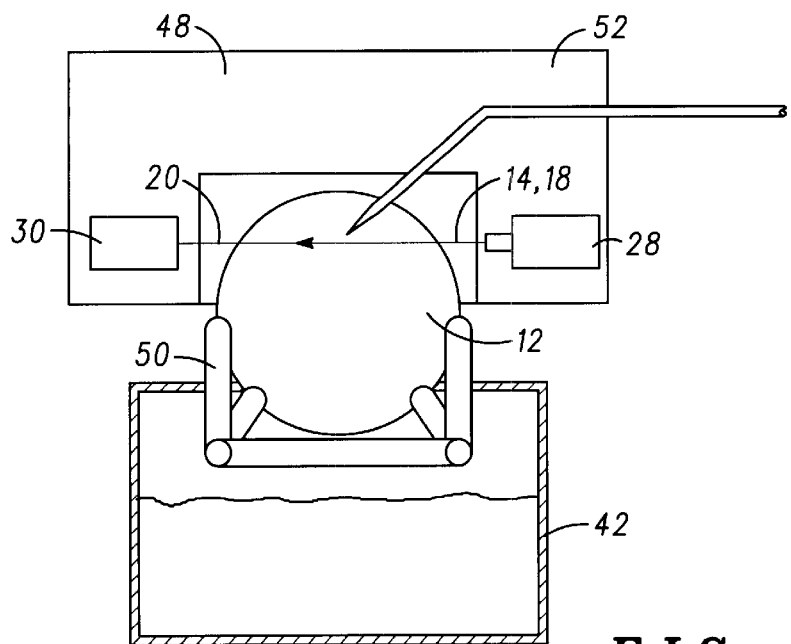
FIG. 5 is a side view of a wet processing arrangement illustrating a further system according to the present invention.

FIG. 5 is a side view of a wet processing arrangement, illustrating a system according to the present invention. A boat 50 containing the wafers 12 is removed from the wet processing tank 42 in order to perform a method according to the present invention. A measurement system 48 is provided that can be moved over the wafers 12. All wafer locations can be measured. It is again possible to project the first laser beam 14 from both sides on the wafers. The second laser pulses 18 are projected from a laser source 28, and the reflected pulses 20 are detected by a detector 30. Additionally, a $N_2$ supply 52 is provided for drying the measurement area.

The wet tool arrangements that are described with reference to FIGS. 3 to 5 preferably use wet solutions consisting primarily of acids. The system and method according to the present invention work in solutions that remove significant layers of material from the wafer surface. It is possible to provide a reference by a separate tank using deionised (DI) water to subtract out the contribution of the liquid to the measurement. Additionally, the liquid properties, such as density, can be measured with reference to the DI water tank with no wafers inside. This could be done with a reference tank of the acid or etchant solution which does not contain wafers and which is not used for processing, the signal information being stored in a processor as a reference. The measurement of the liquid properties may be used to determine the composition, for example the concentration of the etchant or acid.

Figure 6:
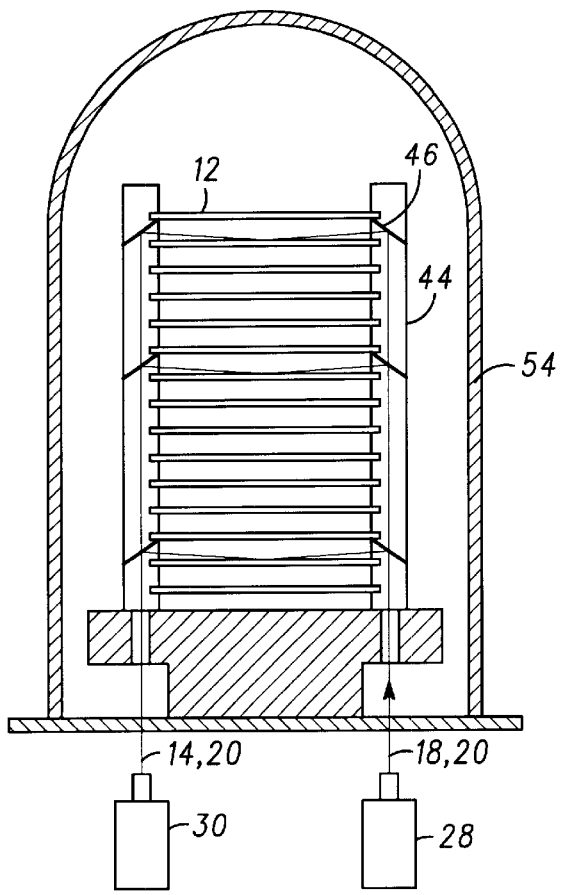
FIG. 6 is a side view of a diffusion tube, illustrating a further system according to the present invention.

FIG. 6 is a side view of a diffusion tube 54 illustrating a further system according to the present invention. In a quartz diffusion tube 54 a plurality of wafers is arranged. The laser beams are directed through a quartz boat 44 and by mirrors 46, similarly to the embodiment according to FIG. 4. Also the arrangement of the laser sources 28, 30 and the detector 30 is similar to the arrangement of the embodiment according to FIG. 4.

Also in the case of diffusion process technology, the system and the method according to the present invention work on areas with and without topography. The invention can be applied on all film deposition diffusion processes. Additional information besides the thickness would be the composition and density of the film or the individual layers of a film stack. The method according to the present invention eliminates the need for test wafers and errors associated with targeting deposition times from unpatterned wafers versus products, i.e. wafers with topography and features. The method according to the present invention can be performed from inside or outside the diffusion tube, or within the tube in a shielded apparatus. The edges of stacked wafers can be measured. The system can be angled or scanned by system movement to perform measurements by zone, or ultimately all wafers if desired. It is also possible to perform a correlation from outside the tube to subtract out the effect of the diffusion tube by using a reference signal approach. For rapid thermal processes (RTP) the lamps can be switched of for the measurement, before the process is determined. An additional deposition can be done before the processing is completed.

Figure 7:
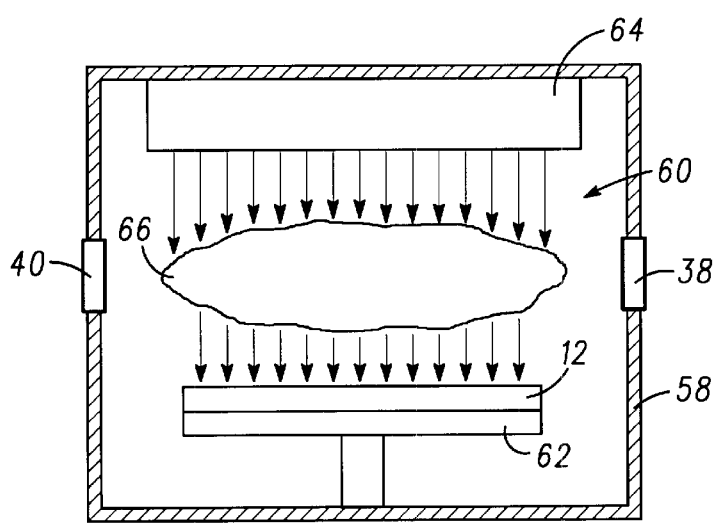
FIG. 7 is a side view of a chamber representing a chemical vapor deposition chamber or a plasma etch chamber, illustrating further systems according to the present invention.

FIG. 7 is a side view of a chamber 58 representing a chemical vapor deposition chamber or a plasma etch chamber, illustrating further systems according to the present invention. Inside the chamber 58 a reactive gas 60 is provided from a shower head 64. A chemical reaction product that is generated in a gas mixing area 66 is deposited on a wafer 12 located on a pedestal 62. The gas mixing may be plasma assisted. In addition to conventional chambers, windows 38, 40 are provided, the function of which is described further below.

Figure 8:
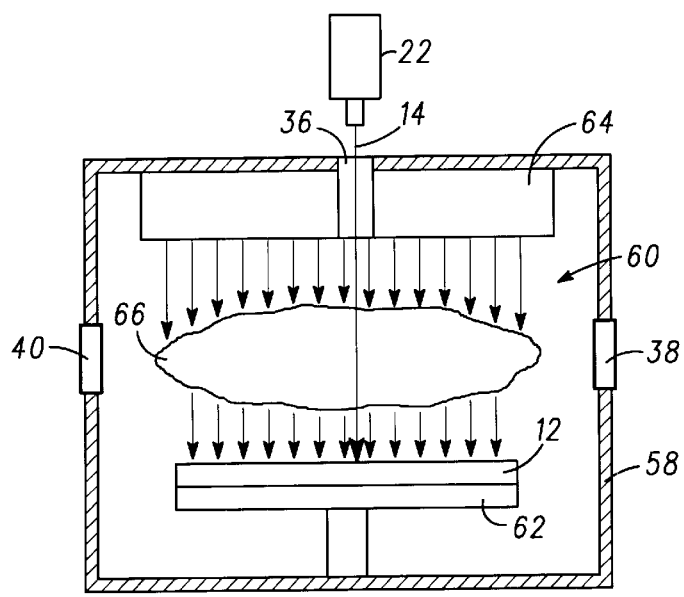
FIG. 8 is a side view of a chamber according to FIG. 7, illustrating a process step of a method according to the present invention.

FIG. 8 is a side view of a chamber 58 according to FIG. 7, illustrating a process step of a method according to the present invention. A first laser pulse 14 from a laser source 22 reaches the wafer 12 through a port (not shown) in the shower head 64, thereby creating an acoustical wave according to the present invention.

Figure 9:
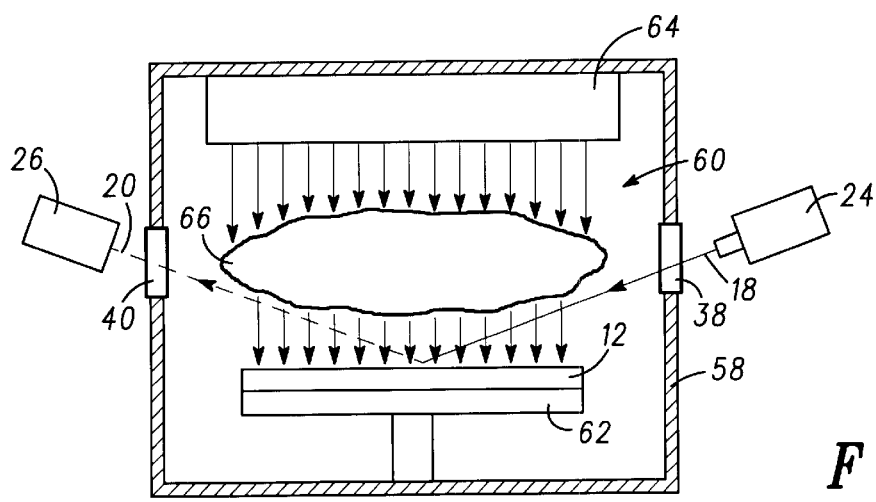
FIG. 9 is a side view of a chamber according to FIGS. 7 and 8, illustrating a further process step of a method according to the present invention.

FIG. 9 is a side view of a chamber 58 according to FIGS. 7 and 8, illustrating a further process step of a method according to the present invention. A series of second laser pulses 18 from a laser source 24 is projected on the wafer 12 through a window 38 in the chamber 58. By measuring the reflected laser pulses 20 that reach a detector 26 through a window 40 in the chamber 58 the times of reflection property changes of the wafer surface are sensed. Thus, the thickness and/or physical and chemical properties of at least one layer on the wafer surface can be determined.

Figure 10:
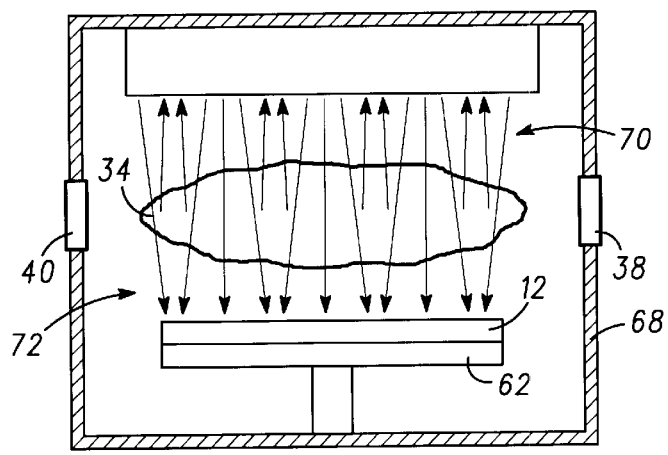
FIG. 10 is a side view of a physical vapor deposition sputter chamber, illustrating a further system according to the present invention.

FIG. 10 is a side view of a physical vapor deposition (PVD) sputter chamber 68, illustrating a further system according to the present invention. Inside the PVD sputter chamber 68 a plasma 34 is provided. Ions 70 from the plasma 34 strike the metal to be deposited and the sputtered metal 72 is deposited on the wafer 72. In addition to conventional PVD sputter chambers, windows 38, 40 are provided, the function of which is described further below.

Figure 11:
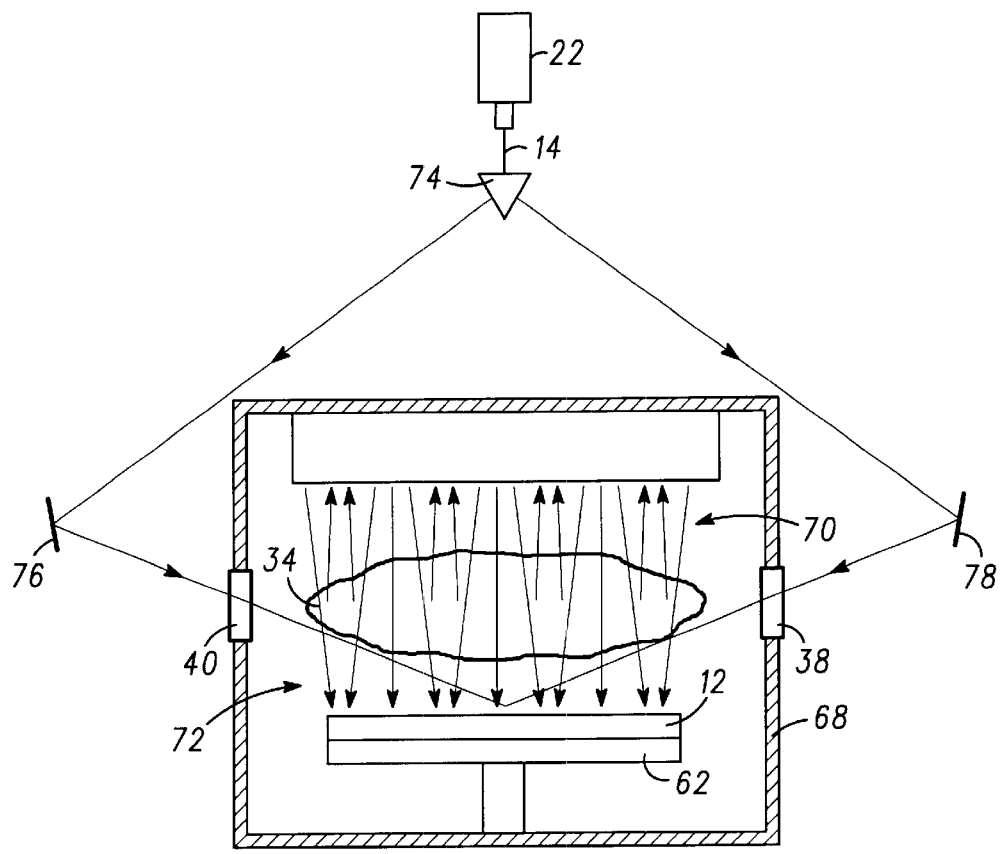
FIG. 11 is a side view of a physical vapor deposition sputter chamber according to FIG. 10, illustrating a process step of a method according to the present invention.

FIG. 11 is a side view of a physical vapor deposition sputter chamber 68 according to FIG. 10, illustrating a process step of a method according to the present invention. A first laser pulse 14 from a laser source 22 is split by a beam splitter 74, reflected by a mirror 76 and a mirror 78, respectively, and it reaches the wafer 12 through a window 38 and a window 40, respectively, thereby creating an acoustical wave according to the present invention.

Figure 12:
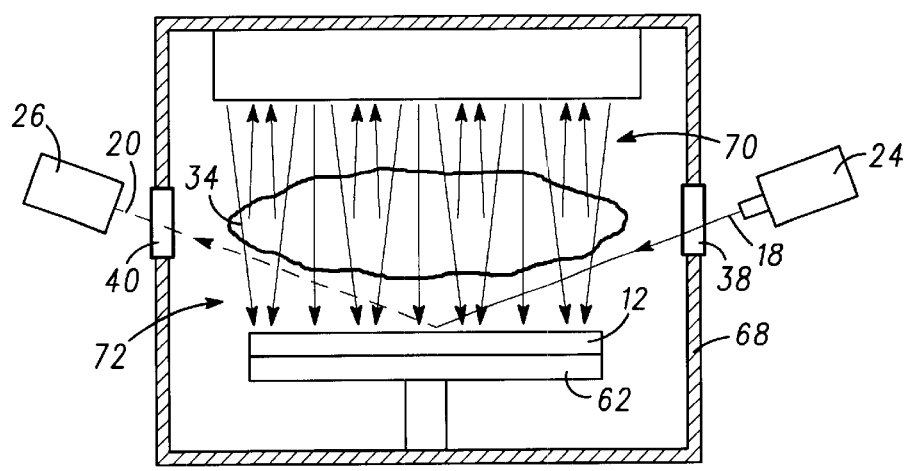
FIG. 12 is a side view of a physical vapor deposition sputter chamber according to FIGS. 10 and 11, illustrating a further process step of a method according to the present invention.

FIG. 12 is a side view of a physical vapor deposition sputter chamber 68 according to FIGS. 10 and 11, illustrating a further process step of a method according to the present invention. The process step is similar to the process step described with reference to FIG. 9.

Figure 13:
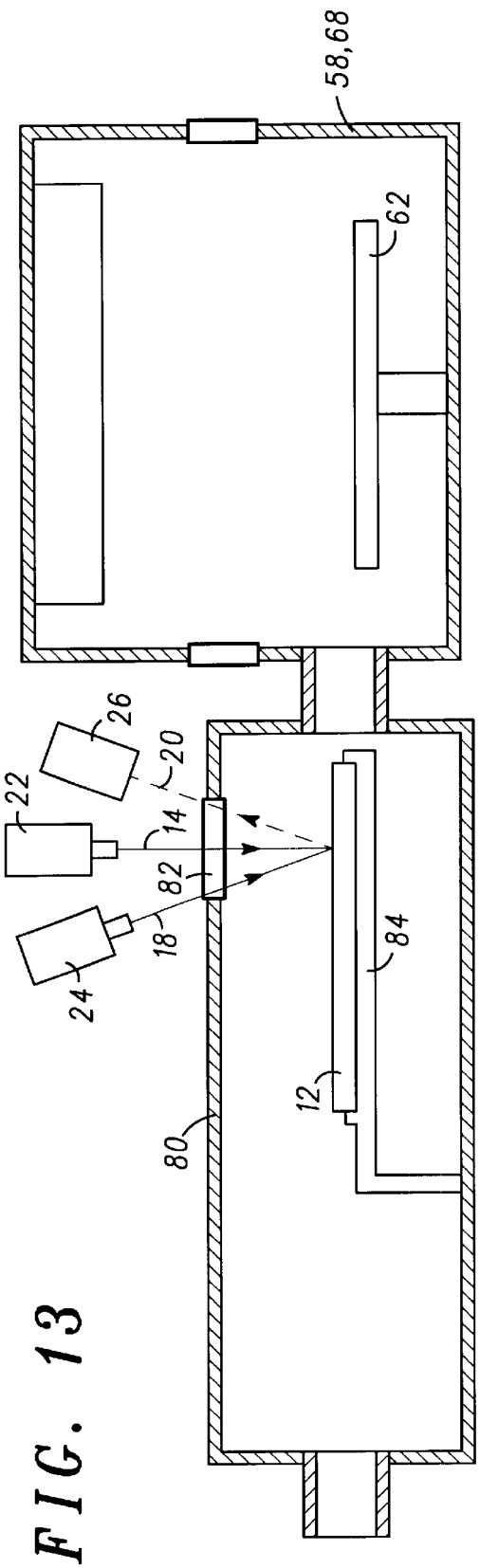
FIG. 13 is a side view of a process chamber and a transfer chamber, illustrating a further system according to the present invention.

FIG. 13 is a side view of a process chamber 58, 68 and a transfer chamber 80, illustrating a further system according to the present invention. The process chamber 58, 68 can be, for example, a CVD, plasma etch, PVD, or RTP chamber. The wafer 12 has been extracted from the process chamber 58, 68 by a robotic handling system 84. Thus, the measuring method according to the present invention can be performed outside the process chamber 58, 68. The first laser pulse 14 from the laser source 22 and the series of second laser pulses 24, 26 from the laser source 24 are projected through the same window 82 or view port. Also the reflected laser pulses 20 reach the detector 26 through the same window 82. There are further embodiments within the scope of the present invention in which the transfer chamber comprises more than one window for the distinct laser pulses.

There are several advantages related to the external measuring system and method according to FIG. 13. Many systems already have view ports on the transfer chamber 80. For example, it is possible to use one of these view port locations for multiple process chambers 58, 68. Further, no complications occur due to an interference of the measuring device and the process. Moreover, the wafer 12 can be kept in vacuum, so that re-processing is possible. Additionally, by using the movements of robot stepper motors for the robotic handling system 84, across-wafer uniformity can be measured.

Figure 14:
FIG. 14 is a flow diagram illustrating a method according to the present invention.

FIG. 14 is a flow diagram for illustrating a method according to the present invention. In a first step S01 a first laser pulse is projected on the surface of a layer on a semiconductor wafer. Thereby, the surface is locally heated and an acoustical wave is generated. The acoustical wave propagates through the layer and is partially reflected at interfaces to neighboring layers. The echo that returns at the surface of the upper layer changes the reflection property of the wafer. In order to sense the reflection property, in step S02 second laser pulses are projected on the surface of the semiconductor wafer. In step S03 the reflection property changes are sensed by measuring the reflected second laser pulses. In step S04 the thickness of the layer is determined by analyzing the times of reflection property changes.

While the invention has been described in terms of particular structures, devices and methods, those of skill in the art will understand based on the description herein that it is not limited merely to such examples and that the full scope of the invention is properly determined by the claims that follow.

What is claimed is:

1. A method of determining a thickness of at least one layer on at least one semiconductor wafer, comprising the steps of:

projecting a first laser pulse on a surface of the at least one layer, thereby generating an acoustical wave due to heating of the surface of the at least one layer, after a propagation time of the acoustical wave, projecting a series of second laser pulses on the surface of the at least one layer, measuring reflected laser pulses of the second laser pulses, thereby sensing the times of reflection property changes of the surface of the at least one layer, and determining the thickness of the at least one layer by analyzing the times of reflection property changes.

2. The method according to claim 1, wherein the first laser pulse is generated by a first laser source, and the series of second laser pulses is generated by a second laser source.

3. The method according to claim 1, wherein the first laser pulse and the series of second laser pulses are generated by the same laser source.

4. The method according to claim 1, wherein the first laser pulse and the series of second laser pulses propagate on different light paths between a source and the at least one semiconductor wafer.

5. The method according to claim 1, wherein the first laser pulse and the series of second laser pulses propagate on essentially the same light path between a source and the at least one semiconductor wafer.

6. The method according to claim 1, wherein the thickness of layers in multi-layer film stacks is measured.

7. The method according to claim 1, wherein multiple locations across the semiconductor wafer are measured to determine wafer uniformity.

8. The method according to claim 1, wherein the at least one layer is deposited by electroplating.

9. The method according to claim 1, wherein the thickness of the at least one layer is determined to monitor a plasma etch process.

10. The method according to claim 1, wherein the thickness of the at least one layer is determined to monitor a diffusion process.

11. The method according to claim 1, wherein the thickness of the at least one layer is determined to monitor a chemical vapor deposition process.

12. The method according to claim 1, wherein the thickness of the at least one layer is determined to monitor a physical vapor deposition process.

13. The method according to claim 1, wherein the thickness of the at least one layer is determined to monitor a wet process.

* * * * *